United States Patent
Ding et al.

(10) Patent No.: US 7,957,179 B2
(45) Date of Patent: Jun. 7, 2011

(54) MAGNETIC SHIELDING IN MAGNETIC MULTILAYER STRUCTURES

(75) Inventors: Yunfei Ding, Milpitas, CA (US); Zhanjie Li, Santa Clara, CA (US)

(73) Assignee: Grandis Inc., Milpitas, CA (US)

( * ) Notice: Subject to any disclaimer, the term of this patent is extended or adjusted under 35 U.S.C. 154(b) by 33 days.

(21) Appl. No.: 11/769,645

(22) Filed: Jun. 27, 2007

(65) Prior Publication Data

US 2010/0214835 A1  Aug. 26, 2010

(51) Int. Cl.
    *G11C 11/00* (2006.01)
(52) U.S. Cl. ......... 365/158; 365/148; 365/171; 977/935
(58) Field of Classification Search .............. 365/80, 365/83, 85, 148, 158, 171, 173; 257/421, 257/E21.665; 438/3; 977/933–935
    See application file for complete search history.

(56) References Cited

U.S. PATENT DOCUMENTS

| | | | |
|---|---|---|---|
| 5,347,485 A * | 9/1994 | Taguchi et al. | |
| 5,432,734 A * | 7/1995 | Kawano et al. | |
| 5,448,515 A * | 9/1995 | Fukami et al. | |
| 5,695,864 A | 12/1997 | Slonczewski | |
| 5,949,622 A * | 9/1999 | Kamiguchi et al. | |
| 6,100,188 A * | 8/2000 | Lu et al. | |
| 6,124,711 A | 9/2000 | Tanaka et al. | |
| 6,137,662 A | 10/2000 | Huai et al. | |
| 6,146,775 A | 11/2000 | Fujita et al. | |
| 6,172,904 B1 | 1/2001 | Anthony et al. | |
| 6,175,476 B1 | 1/2001 | Huai et al. | |
| 6,196,465 B1 * | 3/2001 | Awano | |
| 6,198,610 B1 * | 3/2001 | Kawawake et al. | |
| 6,201,673 B1 | 3/2001 | Rottmayer et al. | |
| 6,211,090 B1 | 4/2001 | Durlam et al. | |
| 6,222,707 B1 | 4/2001 | Huai et al. | |
| 6,266,218 B1 | 7/2001 | Carey et al. | |
| 6,347,049 B1 * | 2/2002 | Childress et al. | |
| 6,351,355 B1 | 2/2002 | Min et al. | |
| 6,351,409 B1 | 2/2002 | Rizzo et al. | |
| 6,381,105 B1 | 4/2002 | Huai et al. | |
| 6,430,085 B1 * | 8/2002 | Rizzo | |
| 6,438,026 B2 | 8/2002 | Gillies et al. | |
| 6,447,935 B1 | 9/2002 | Zhang et al. | |
| 6,469,926 B1 * | 10/2002 | Chen | |
| 6,518,071 B1 | 2/2003 | Durlam et al. | |
| 6,538,859 B1 * | 3/2003 | Gill | |
| 6,545,906 B1 | 4/2003 | Savtchenko et al. | |
| 6,603,677 B2 | 8/2003 | Redon et al. | |
| 6,633,498 B1 | 10/2003 | Engel et al. | |

(Continued)

FOREIGN PATENT DOCUMENTS

JP  2006-093432  4/2006

(Continued)

OTHER PUBLICATIONS

Albert, et al., "Spin-polarized current switching of a Co thin film nanomagnet", *Applied Physics Letters*, vol. 77, No. 23, pp. 3809-3811, Dec. 4, 2000.

(Continued)

*Primary Examiner* — Richard Elms
*Assistant Examiner* — Harry W Byrne
(74) *Attorney, Agent, or Firm* — Fish & Richardson P.C.

(57) ABSTRACT

Techniques and device designs associated with devices having magnetically shielded magnetic or magnetoresistive tunnel junctions (MTJs) and spin valves that are configured to operate based on spin-transfer torque switching.

15 Claims, 13 Drawing Sheets

U.S. PATENT DOCUMENTS

| | | | |
|---|---|---|---|
| 6,649,960 B1 | 11/2003 | Cross | |
| 6,687,098 B1 | 2/2004 | Huai | |
| 6,714,444 B2 | 3/2004 | Huai et al. | |
| 6,717,194 B2* | 4/2004 | Liu et al. | |
| 6,768,150 B1* | 7/2004 | Low et al. | |
| 6,771,534 B2 | 8/2004 | Stipe | |
| 6,791,868 B2 | 9/2004 | Gider et al. | |
| 6,801,414 B2* | 10/2004 | Amano et al. | |
| 6,801,471 B2* | 10/2004 | Viehmann et al. | |
| 6,829,161 B2 | 12/2004 | Huai et al. | |
| 6,838,740 B2 | 1/2005 | Huai et al. | |
| 6,847,547 B2 | 1/2005 | Albert et al. | |
| 6,888,704 B1 | 5/2005 | Diao et al. | |
| 6,888,742 B1 | 5/2005 | Nguyen et al. | |
| 6,893,741 B2 | 5/2005 | Doerner et al. | |
| 6,920,063 B2 | 7/2005 | Huai et al. | |
| 6,927,468 B2* | 8/2005 | Yoda et al. | 257/422 |
| 6,933,155 B2 | 8/2005 | Albert et al. | |
| 6,950,335 B2 | 9/2005 | Dieny et al. | |
| 6,958,927 B1 | 10/2005 | Nguyen et al. | |
| 6,967,863 B2 | 11/2005 | Huai | |
| 6,979,586 B2 | 12/2005 | Guo et al. | |
| 6,985,385 B2 | 1/2006 | Nguyen et al. | |
| 6,989,972 B1 | 1/2006 | Stoev et al. | |
| 6,992,359 B2 | 1/2006 | Nguyen et al. | |
| 7,006,375 B2 | 2/2006 | Covington | |
| 7,009,877 B1 | 3/2006 | Huai et al. | |
| 7,027,268 B1 | 4/2006 | Zhu et al. | |
| 7,057,921 B2 | 6/2006 | Valet | |
| 7,088,609 B2 | 8/2006 | Valet | |
| 7,098,494 B2 | 8/2006 | Pakala et al. | |
| 7,105,372 B2 | 9/2006 | Min et al. | |
| 7,106,559 B2* | 9/2006 | Hasegawa et al. | |
| 7,106,624 B2 | 9/2006 | Huai et al. | |
| 7,110,287 B2 | 9/2006 | Huai et al. | |
| 7,126,201 B2* | 10/2006 | Matsutera et al. | |
| 7,176,065 B2* | 2/2007 | Seyyedy et al. | |
| 7,187,577 B1* | 3/2007 | Wang et al. | |
| 7,190,558 B2* | 3/2007 | Iwasaki et al. | |
| 7,224,601 B2 | 5/2007 | Panchula et al. | |
| 7,224,630 B2* | 5/2007 | Andre et al. | |
| 7,262,064 B2* | 8/2007 | Ohba et al. | |
| 7,272,034 B1* | 9/2007 | Chen et al. | |
| 7,272,035 B1* | 9/2007 | Chen et al. | |
| 7,286,395 B2* | 10/2007 | Chen et al. | |
| 7,289,356 B2* | 10/2007 | Diao et al. | |
| 7,307,302 B2 | 12/2007 | Saito | |
| 7,345,912 B2 | 3/2008 | Luo et al. | |
| 7,379,327 B2 | 5/2008 | Chen et al. | |
| 7,430,135 B2 | 9/2008 | Huai et al. | |
| 2002/0015823 A1 | 2/2002 | Mauler et al. | |
| 2002/0037595 A1 | 3/2002 | Hosotani | |
| 2002/0097534 A1 | 7/2002 | Sun et al. | |
| 2002/0105827 A1 | 8/2002 | Redon et al. | |
| 2002/0135955 A1* | 9/2002 | Ono et al. | 360/324.12 |
| 2003/0184918 A1* | 10/2003 | Lin et al. | 360/314 |
| 2003/0222322 A1 | 12/2003 | Park | |
| 2003/0235016 A1* | 12/2003 | Gill | 360/324.12 |
| 2004/0021189 A1* | 2/2004 | Yoda et al. | 257/421 |
| 2004/0130936 A1 | 7/2004 | Nguyen et al. | |
| 2004/0136231 A1 | 7/2004 | Huai et al. | |
| 2004/0170055 A1 | 9/2004 | Albert et al. | |
| 2004/0235201 A1 | 11/2004 | Albert et al. | |
| 2004/0249428 A1* | 12/2004 | Wang et al. | 607/116 |
| 2005/0018476 A1* | 1/2005 | Kamijima et al. | 365/158 |
| 2005/0041342 A1 | 2/2005 | Huai et al. | |
| 2005/0041456 A1 | 2/2005 | Saito | |
| 2005/0063222 A1 | 3/2005 | Huai et al. | |
| 2005/0106810 A1 | 5/2005 | Pakala et al. | |
| 2005/0110004 A1 | 5/2005 | Parkin et al. | |
| 2005/0136600 A1 | 6/2005 | Huai | |
| 2005/0174821 A1* | 8/2005 | Zheng et al. | 365/8 |
| 2005/0184839 A1 | 8/2005 | Nguyen et al. | |
| 2005/0201022 A1* | 9/2005 | Horng et al. | 360/324.11 |
| 2005/0237787 A1* | 10/2005 | Huai et al. | 365/158 |
| 2005/0248888 A1 | 11/2005 | Dieny et al. | |
| 2005/0254286 A1 | 11/2005 | Valet | |
| 2005/0254287 A1 | 11/2005 | Valet | |
| 2006/0018057 A1 | 1/2006 | Huai et al. | |
| 2006/0049472 A1 | 3/2006 | Diao et al. | |
| 2006/0077707 A1* | 4/2006 | Deak | 365/171 |
| 2006/0081953 A1 | 4/2006 | Nguyen et al. | |
| 2006/0102969 A1 | 5/2006 | Huai et al. | |
| 2006/0114618 A1 | 6/2006 | Hosomi et al. | |
| 2006/0128038 A1 | 6/2006 | Pakala et al. | |
| 2006/0141640 A1 | 6/2006 | Huai et al. | |
| 2006/0187591 A1 | 8/2006 | Gill et al. | |
| 2006/0192237 A1 | 8/2006 | Huai | |
| 2006/0221676 A1 | 10/2006 | Qian et al. | |
| 2006/0281258 A1 | 12/2006 | Dieny et al. | |
| 2007/0047294 A1 | 3/2007 | Panchula | |
| 2007/0063236 A1 | 3/2007 | Huai et al. | |
| 2007/0063237 A1 | 3/2007 | Huai et al. | |
| 2007/0086121 A1 | 4/2007 | Nagase et al. | |
| 2007/0096229 A1* | 5/2007 | Yoshikawa et al. | 257/421 |
| 2007/0121373 A1 | 5/2007 | Koga | |
| 2007/0171694 A1 | 7/2007 | Huai et al. | |
| 2007/0279967 A1 | 12/2007 | Luo et al. | |
| 2008/0061388 A1 | 3/2008 | Diao et al. | |
| 2008/0205121 A1 | 8/2008 | Chen et al. | |
| 2008/0219043 A1 | 9/2008 | Yoon et al. | |
| 2009/0050991 A1 | 2/2009 | Nagai | |

FOREIGN PATENT DOCUMENTS

| | | |
|---|---|---|
| WO | WO 2004/000369 | 12/2003 |
| WO | WO 2004/008536 | 1/2004 |
| WO | WO 2005/059955 | 6/2005 |
| WO | WO2007/035786 | 3/2007 |
| WO | WO2007/075889 | 7/2007 |
| WO | WO 2007/117392 | 11/2008 |
| WO | WO 2009/003060 | 12/2008 |
| WO | WO 2009/026249 | 2/2009 |

OTHER PUBLICATIONS

Berger, "Emission of spin waves by a magnetic multilayer traversed by a current", *Physical Review B*, vol. 54, No. 13, pp. 9353-9358, Oct. 1, 1996.

Cowburn et al., "Lateral interface anisotropy in nanomagnets," Journal of Applied Physics, 87(9): 7067-7069 (May 1, 2000).

Devolder, T. et al., "Instability threshold versus switching threshold in spin-transfer-induced magnetization switching", Physical Review B71, 184401-1-184401-6 (2005).

Doi, et al., "Magnetism of $Co_{1-x}Fe_x$-NOL in Specular Spin-Valves", *IEEE Transactions on Magnetics*, vol. 40, No. 4, pp. 2263-2265, Jul. 2004.

Inomata et al., "Size-independent spin switching field using synthetic antiferromagnets," Applied Physics Letters 82(16): 2667-2669 (Apr. 21, 2003).

Leighton et al., "Coercivity Enhancement in Exchange Biased Systems Driven by Interfacial Magnetic Frustration," Physical Review Letters 84(15): 3466-3469 (Apr. 10, 2000).

Mancoff, F.B. et al., "Phase-locking in double-point-contact spin-transfer devices", Nature, vol. 437:393-395 (2005).

Sharrock, M.P. et al., "Kinetic Effects in Coercivity Measurements", IEEE Transactions on Magnetics, vol. Mag-17, No. 6:3020-3022 (1981).

Slonczewski, et al., "Current-driven excitation of magnetic multilayers", *Journal of Magnetism and Magnetic Materials*, vol. 159, pp. L1-L7, 1996.

Thirion, C. et al., "Switching of magnetization by nonlinear resonance studied in single nanoparticles", Nature Materials, Nature Publishing Group, www.nature.com/naturematerials, vol. 2, 524-527 (Aug. 2003).

Tulapurkar, et al., "Subnanosecond magnetization reversal in magnetic nanopillars by spin angular momentum transfer", *Applied Physics Letters*, vol. 85, No. 22, pp. 5358-5360, Nov. 29, 2004.

Xi, Haiwen et al., "Spin-current effect on ferromagnetic resonance in patterned magnetic thin film structures", J of Applied Physics 97, 033904-1-033904-5 (2005).

Zhang, et al., "40% tunneling magnetoresistance after anneal at 380 C for tunnel junctions with iron-oxide interface layers", *Journal of Applied Physics*, vol. 89, No. 11, pp. 6665-6667, Jun. 1, 2001.

Cowache et al., "Spin-valve structures with NiO pinning layers," IEEE Transactions on Magnetics, vol. 34, Iss. 4, part 1, (Jul. 1998) [abstract only].

Dokupil et al., Magnetostriction in combination with GMR/TMR-structures [online] Jun. 2, 2005, [retrieved pn Sep. 5, 2007] <URL: http://www.science24.com/paper/3919 >[abstract only].

International Search Report and Written Opinion dated Nov. 26, 2008 for Application No. PCT/US06/48793, 11 pages.

International Search Report and Written Opinion dated Aug. 20, 2008 for Application No. PCT/US07/08203, 12 pages.

International Search Report and Written Opinion dated Nov. 18, 2008 for Application No. PCT/US2008/068230, 9 pages.

International Search Report and Written Opinion dated Nov. 21, 2008 for PCT/US2008/073512, 11 pages.

USPTO Non-Final Office Action in U.S. Appl. No. 11/232,356, mailed Jan. 23, 2009, 42 pages.

* cited by examiner

US 7,957,179 B2

MAGNETIC SHIELDING IN MAGNETIC MULTILAYER STRUCTURES

BACKGROUND

This application relates to magnetic shielding in magnetic multilayer structures including spin valve and magnetic tunnel junction (MTJ) in spin-transfer torque devices.

Various magnetic multilayer structures include at least one ferromagnetic layer configured as a "free" layer whose magnetic direction can be changed by an external magnetic field or a spin-polarized current. Magnetic memory devices may be constructed using such multilayer structures where information is stored based on the magnetic direction of the free layer.

FIG. 1A shows one example for such a multilayer structure in form of a magnetic or magnetoresistive tunnel junction (MTJ) 100. This MTJ 100 includes at least three layers: two ferromagnetic layers 111 and 112, and a thin spacer layer 130 of a non-magnetic insulator (e.g., aluminum oxide) as a barrier layer between the two ferromagnetic layers 111 and 112. The insulator material for the middle barrier layer 130 is not electrically conductive and hence functions as a barrier between the two ferromagnetic layers 112 and 113. When the thickness of the insulator layer 130 is sufficiently thin, e.g., a few nanometers or less, electrons in the two ferromagnetic layers 111 and 113 can "penetrate" through the thin layer of the insulator due to a tunneling effect under a bias voltage applied to the two ferromagnetic layers 111 and 112 across the barrier layer 130. The resistance to the electric current across the MTJ structure 100 varies with the relative direction of the magnetizations in the two ferromagnetic layers. When the magnetizations of the two ferromagnetic layers 111 and 112 are parallel to each other, the resistance across the MTJ structure 100 is at a minimum value $R_P$. When the magnetizations of the two ferromagnetic layers 111 and 112 are opposite to or anti-parallel with each other, the resistance across the MTJ 100 is at a maximum value $R_{AP}$. The magnitude of this effect can be characterized by a tunneling magnetoresistance (TMR) defined as $(R_{AP}-R_P)/R_P$.

The relationship between the resistance to the current flowing across the MTJ 100 and the relative magnetic direction between the two ferromagnetic layers 111 and 112 in the TMR effect can be used for nonvolatile magnetic memory devices to store information in the magnetic state of the MTJ. Magnetic random access memory (MRAM) and other magnetic memory devices based on the TMR effect, for example, may be an alternative to and compete with electronic RAM and other storage devices in various applications. In such magnetic memory devices, one of the ferromagnetic layer 111 and 112, the layer 111 in FIG. 1, is configured to have a fixed magnetic direction by having an anti-ferromagnetic pinning layer and the other ferromagnetic layer 112 is a "free" layer whose magnetic direction can be changed to be either parallel or opposite to the fixed direction. Information is stored based on the relative magnetic direction of the two ferromagnetic layers on two sides of the barrier of the MTJ. For example, binary bits "1" and "0" may be recorded as the parallel and anti-parallel orientations of the two ferromagnetic layers in the MTJ.

Recording or writing a bit in the MTJ 100 can be achieved by switching the magnetization direction of the free layer, e.g., by applying a writing magnetic field generated by supplying currents to write lines disposed in a cross stripe shape. FIG. 1B illustrates a memory device that places the MTJ 100 between two cross conductor lines 140 and 150 that carry currents 142 and 152, respectively. Magnetic fields 143 and 153 that are respectively generated by the currents 142 and 152 collectively produce the writing magnetic field at the MTJ 100 to change the magnetization of the free layer 112. In this design, the field-switched MTJ 100 is magnetically coupled to the conductor lines 140 and 150 via the magnetic fields 143 and 153 produced by the currents 142 and 152. The switching of the free layer 112 is based on such magnetic coupling via the magnetic fields 143 and 153 produced by the currents 142 and 152.

MTJs can also be structured to allow for switching of the free layer by a spin polarized current flowing across the MTJ based on the spin-transfer torque effect without the need for the external writing magnetic field shown in FIG. 1B. In the spin-transfer torque switching, the current required for changing the magnetization of the free layer can be small (e.g., 0.5 mA or lower in some MTJs) and significantly less than a current used in the field switching shown in FIG. 1B. Therefore, the spin-transfer torque switching in an MTJ cell can be used to significantly reduce the power consumption of the cell. In addition, conductor wires for carrying currents that generate the sufficient writing magnetic field for switching the magnetization of the free layer may be eliminated. This allows a spin-transfer torque switching MTJ cell to be smaller than a field switching MTJ cell. Accordingly, the MTJ cells for the spin-transfer torque switching may be fabricated at a higher areal density on a chip than that of field switching MTJ cells and have potential in high density memory devices and applications.

SUMMARY

This application describes, among others, techniques and device designs associated with devices having magnetically shielded magnetic or magnetoresistive tunnel junctions (MTJs) and spin valves that are configured to operate based on spin-transfer torque switching.

In one implementation, a device includes a magnetic cell, a magnetic shielding layer to overlay the magnetic cell on one side of the magnetic cell and operable to magnetically shield the magnetic cell from an external magnetic field, and a circuit electrically coupled to the magnetic shielding layer and the magnetic cell to supply the electric current flowing perpendicularly to and through the magnetic shielding layer and the magnetic cell. The magnetic cell includes a first ferromagnetic layer exhibiting a first magnetization that is switchable between a first direction and a second substantially opposite direction under a spin-transfer torque effect caused by an electric current; a second ferromagnetic layer having a fixed magnetization in one of the first and second directions; and a non-magnetic spacer layer formed between the first and second ferromagnetic layers to allow for passage of the electric current between the first and second ferromagnetic layers. The magnetic shielding layer is electrically conductive and comprising a magnetic material that exhibits a positive susceptibility under the external magnetic field.

In another implementation, a device includes a substrate, a magnetic cell formed over the substrate and a magnetic shielding layer formed over the substrate and comprising a magnetic material that exhibits a negative susceptibility. The magnetic shielding layer is patterned to comprise an opening that penetrates through the magnetic shielding layer and the magnetic cell is located inside the opening of the magnetic shielding layer to be surrounded by the magnetic material of the magnetic shielding layer. The magnetic cell includes a first ferromagnetic layer exhibiting a first magnetization that is switchable between a first direction and a second substantially opposite direction under a spin-transfer torque effect caused by an electric current, a second ferromagnetic layer having a fixed magnetization along one of the first and second directions, and a non-magnetic spacer layer formed between the first and second ferromagnetic layers to allow for passage of the electric current between the first and second ferromagnetic layers. The device also includes a circuit electrically coupled to the magnetic cell and operable to supply the electric current flowing through the magnetic cell.

In yet another implementation, a device includes a conductor line and magnetic cells where each magnetic cell electrically is connected to the conductor line to receive an electric current. Each magnetic cell includes (1) an magnetic element to have a ferromagnetic free layer to switch a magnetization direction under a spin-transfer torque caused by the electric current when the electric current is above a threshold current, and (2) a magnetic shielding element engaged to the magnetic element to magnetically shield the magnetic element from a magnetic field produced by a current in the conductor line and a source outside the magnetic cell. A circuit is included in the device to include isolation transistors where each isolation transistor is electrically connected to a magnetic element inside a respective magnetic cell to control the electric current through the magnetic element. The magnetic shielding element may be made of a magnetic material exhibiting a positive susceptibility and is located between the conductor line and the magnetic element in each magnetic cell or between the conductor line and the magnetic shielding element in each magnetic cell. The magnetic shielding element may also be made of a magnetic material exhibiting a negative susceptibility and be structured to at least partially surround the magnetic element.

The magnetically shielded magnetic elements based on the spin-transfer torque switching may be used to form an array with a high areal density due to the magnetic shielding in each magnetic element which reduces the effect of any magnetic field from adjacent magnetic elements and other sources.

These and other implementations are described in detail in the drawings, the description and the claims.

DETAILED DESCRIPTION

Multilayer magnetic elements described in this application are structured and operated based on the spin-transfer torque effect without relying on an external magnetic field. In such magnetic elements, the presence of an external magnetic field is often undesirable in part because the magnetic field may adversely alter the magnetization direction of the free layer in the magnetic element or adversely affect the switching operation based on the spin-transfer torque effect. Therefore, magnetic devices using such magnetic elements in this application include a magnetic shielding element engaged to each individual magnetic element to shield the magnetic element from the external magnetic field that is produced by one or more sources outside the magnetic element.

The magnetic shielding in each individual magnetic element described in this application can be implemented to achieve various benefits. For example, such magnetically shielded magnetic elements can be used in devices with high density arrays of such magnetic elements that are spatially close to one another. The magnetic shielding element in each magnetic element allows adjacent magnetic elements to be closely packed with each other to achieve high areal density memory arrays because the magnetic interference between adjacent magnetic elements is shielded in addition to shielding of external magnetic fields from other sources.

Figure 1A:
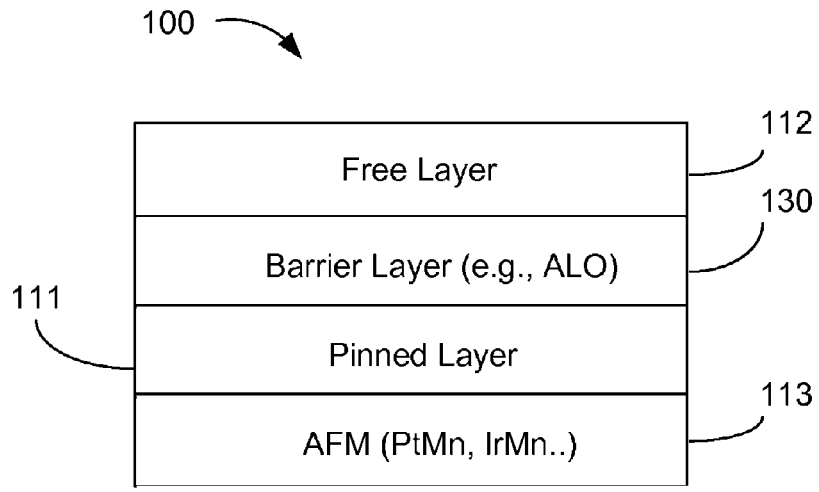
FIGS. 1A and 1B an example of an MTJ cell based on field switching.
Figure 1B:
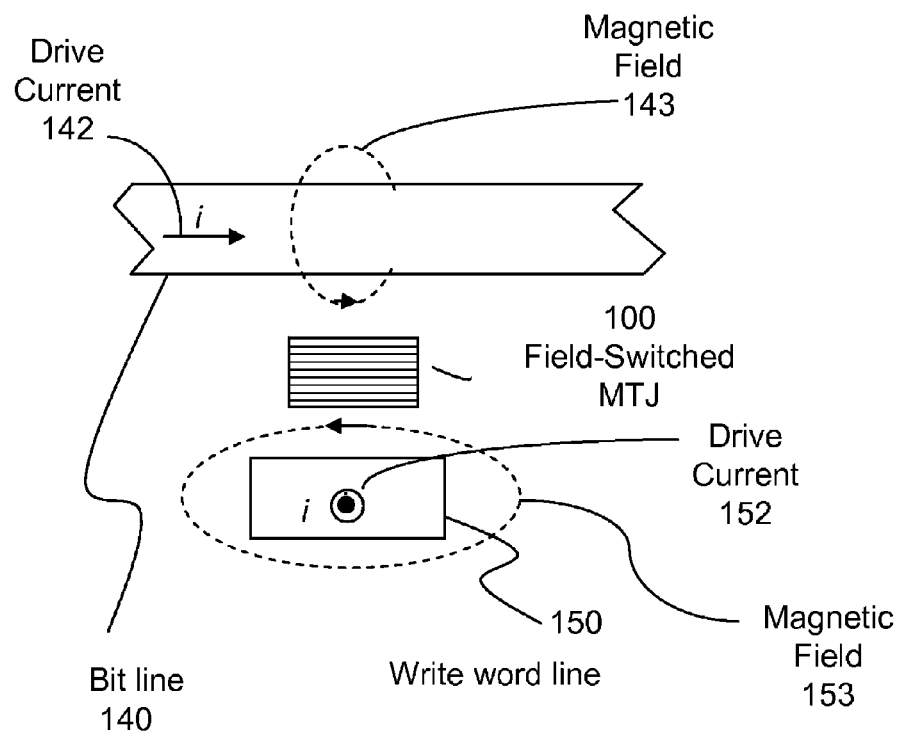
Figure 2:
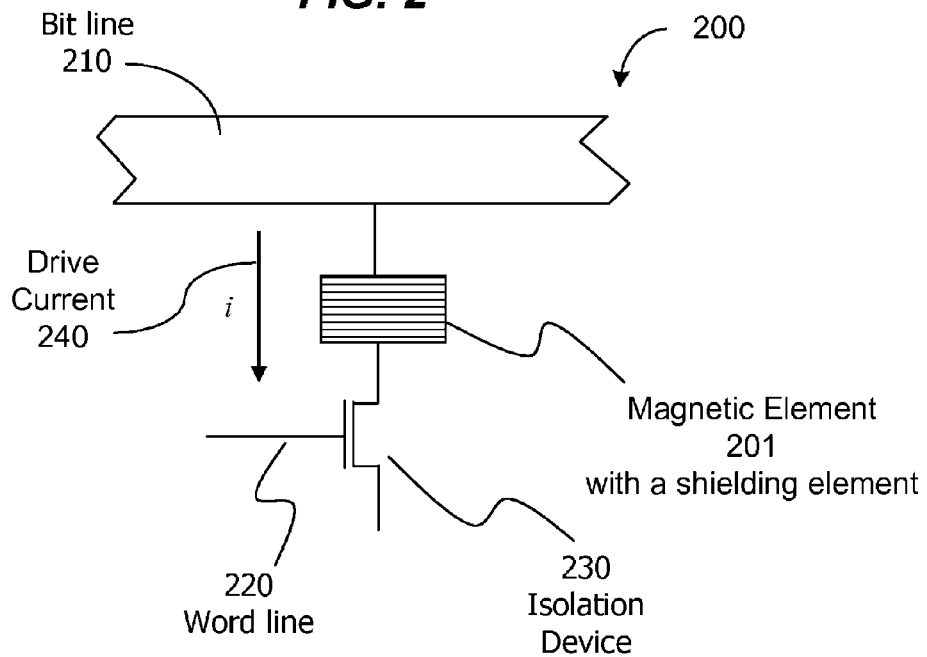
FIG. 2 illustrates a part of an exemplary magnetic device that includes an array of unit cells, where each unit cell includes a magnetic element based on the spin-transfer torque effect and a magnetic shielding element engaged to the magnetic element.

FIG. 2 illustrates a part of an exemplary magnetic device 200 that includes an array of unit cells. Each unit cell includes a magnetic element 201 based on the spin-transfer torque effect and a magnetic shielding element engaged to the magnetic element 201. A conductor line 210 labeled as "bit line" is electrically coupled to the magnetic element 201 by connecting to one end of the magnetic element 201 to supply an electrical drive current 240 through the layers of the magnetic element 201 to effectuate the spin-transfer torque effect in the magnetic element 201. An electronic isolation device 230, such as an isolation transistor, is connected to one side of the magnetic element 201 to control the current 240 in response to a control signal applied to the gate of the transistor 230. A second conductor line 220 labeled as "word line" is electrically connected to the gate of the transistor 230 to supply that control signal. In operation, the drive current 240 flows across the layers in the magnetic element 201 to change magnetization direction of the free layer when the current 240 is greater than a switching threshold which is determined by materials and layer structures of the magnetic element 201. The switching of the free layer in the magnetic element 201 is based on the spin-transfer torque caused by the drive current 240 alone without relying on a magnetic field produced by the lines 210 and 220 or other sources. Notably, the magnetic shielding element for the magnetic element 201 shields the layers inside the element 201 from magnetic fields generated by the conductor lines 210 and 220, adjacent elements 201 and other sources. Therefore, under this design, the switching operation of the magnetic element 201 is not based on magnetic coupling through a magnetic field produced by the lines 210 and 220, adjacent elements 201 and other sources and the magnetic shielding element is provided to magnetically isolate the magnetic element 201 from such magnetic field.

The magnetic element 201 based on the spin-transfer torque effect can be implemented in various configurations, such as an MTJ, a spin valve, a combination of an MTJ and a spin valve, a combination of two MTJs and other configurations. Each of the free and pinned layers can be a single magnetic layer or a composite structure of multiple layers magnetically coupled together. FIGS. 3 through 6 show a few examples of the multilayer structures of the magnetic element 201 without showing the magnetic shielding element. Examples of the magnetic shielding element are shown in FIGS. 7 through 14B.

Figure 3:
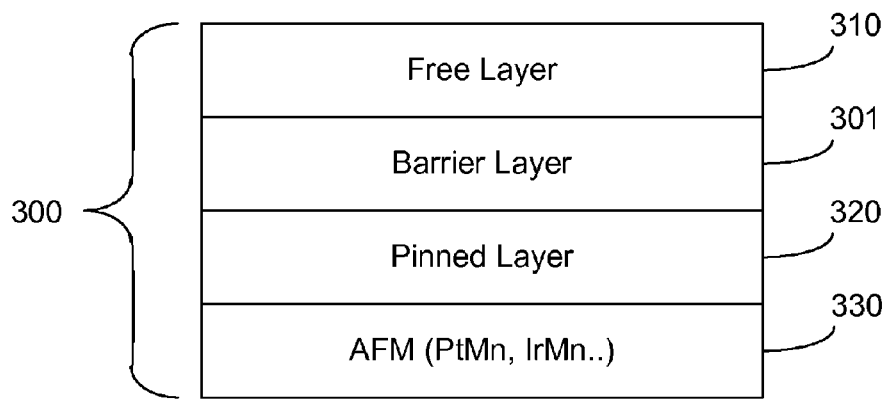
FIG. 3 shows an MTJ based on the spin-transfer torque effect which can be used as the magnetic element in FIG. 2.

FIG. 3 shows an MTJ 300 based on the spin-transfer torque effect which can be used as the magnetic element in FIG. 2. The MTJ 300 can be formed on a substrate of a suitable material such as a Si substrate. The MTJ 300 includes an antiferromagnetic (AFM) layer 330 and a ferromagnetic layer 320 formed on top of the AFM layer 330. After the post annealing, the ferromagnetic layer 320 is pinned with a fixed magnetization. In implementations, this fixed magnetization may be set to be parallel to the substrate (i.e., the substrate surface). On the ferromagnetic layer 320 is a thin insulator barrier layer 301, e.g., a metal oxide layer. A second ferromagnetic layer 310 is formed directly on the barrier layer 301. In addition, a contact layer made of an electrically conducting material (e.g., a metal) is formed on each side of the MTJ 300 as part of the electrical path for the drive current 240 in FIG. 2. The magnetization of the ferromagnetic layer 310 is not pinned and can be freely changed to be either parallel to or anti-parallel to the fixed magnetization of the pinned layer 320. For this reason, the ferromagnetic layer 310 is a free layer (FL) and has its magnetic easy axis substantially along the fixed magnetization direction of the pinned layer 320 and its magnetically hard axis substantially perpendicular to the easy axis.

The materials and layers in the MTJ 300 are configured to allow for control of the magnetization of the ferromagnetic layer 310 by the write current 240 perpendicularly flowing through the MTJ 300 based on spin-transfer torque switching. The spins carried by the applied current across the junction in the current operating range can force the magnetization of the free layer 310 to be substantially parallel to or substantially opposite to the fixed magnetization of the pinned layer 320. Various magnetic systems have competing energy contributions that prevent a perfect parallel or antiparallel alignment of the magnetic domains or nanomagnets in each ferromagnetic layer. In MTJs, the dominant contribution to the energy state of the nanomagnets within the free layer 310 tends to force the nanomagnets into the parallel or antiparallel alignment, thus producing a substantial parallel or antiparallel alignment. In an actual device, each cell may be elliptically shaped and elongated to provide the shape anisotropy in the magnetic recording layer of the MTJ cell, or the free layer 310 may be made of a material with intrinsic magnetic anisotropy, to spatially favor a particular magnetization direction as the easy axis in order to increase the stability of the MTJ cell against perturbations to the magnetization of the MTJ cell, e.g., thermal fluctuation.

Each ferromagnetic layer in FIG. 3 may be a synthetic layer which includes two or more layers. For example, the free layer may be a single layer or a multiple layer configuration. For a single layer case, a ferromagnetic or ferrimagnetic material can be used. The individual layers of the multiple layer configurations could be either a combination of magnetic materials, which are either ferromagnetic or ferrimagnetic, or a combination of magnetic and non-magnetic layers, such as a synthetic layer having two ferromagnetic layers that are separated by a non-magnetic spacer.

Figure 4:
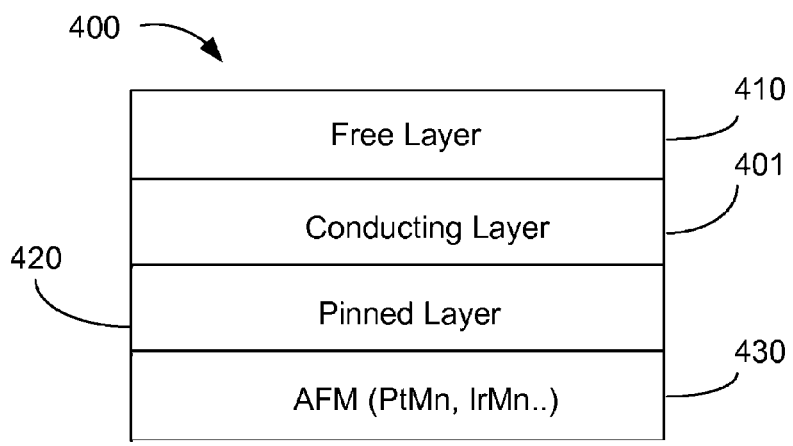
FIG. 4 shows another example of the magnetic element for the device in FIG. 2 in form of a spin valve.

FIG. 4 shows another example of the magnetic element 201 in FIG. 2 in form of a spin value 400. The spin valve 400 includes an AFM layer 430, a pinned ferromagnetic layer 420 adjacent to the AFM layer 430, a conducting spacer layer 401 made of a non-magnetic conducting material, and a free layer 410. Similar to the MTJ, the resistance to the electric current across spin valve layers varies with the relative direction of the magnetizations in the two ferromagnetic layers 410 and 420. When the magnetizations of the two ferromagnetic layers 410 and 420 are parallel to each other, the resistance across the spin valve 400 is at a minimum value. When the magnetizations of the two ferromagnetic layers 410 and 420 are anti-parallel with each other, the resistance across the spin valve 400 is at a maximum value. This effect is known as giant magnetoresistance (GMR).

The multilayer structures in FIGS. 3 and 4 have a similar three-layer structure with a spacer layer (301 in FIGS. 2 and 401 in FIG. 4) between two ferromagnetic layers (310 and 320 in FIGS. 3 and 410 and 420 in FIG. 4). For the MTJ, the spacer layer is a non-magnetic insulating barrier layer. For the spin valve, the spacer layer is a non-magnetic conducting layer. Such structures can be combined to form various magnetic element configurations for the magnetic element 201 in FIG. 2.

Figure 5A:
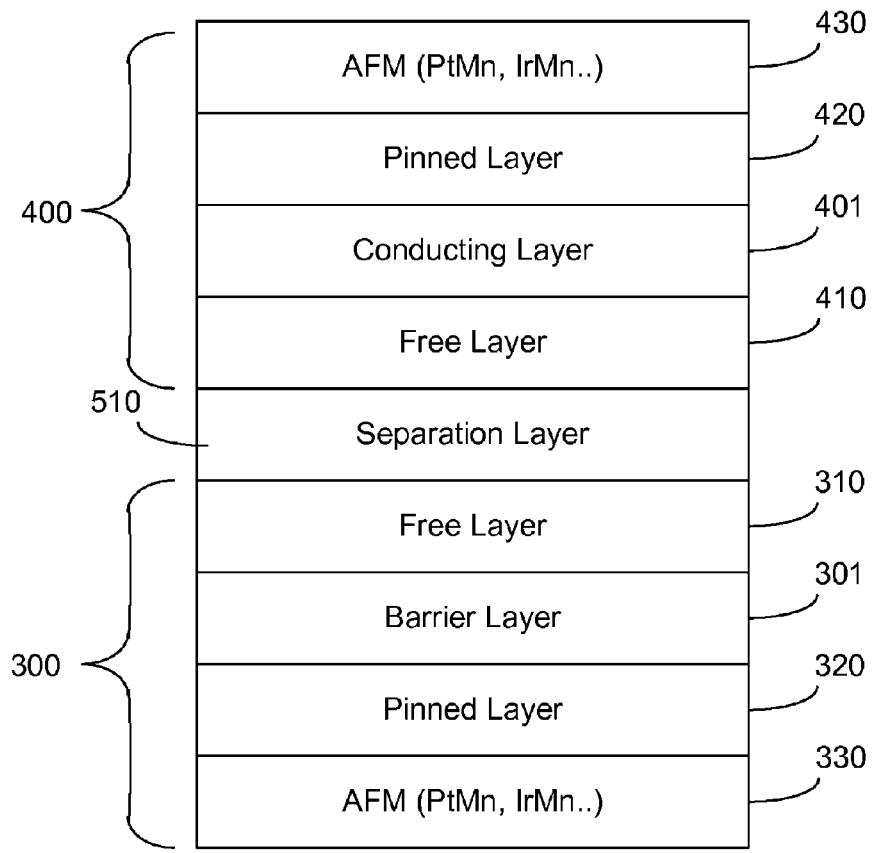
FIG. 5A shows an example of the magnetic element for the device in FIG. 2 in form of a combination of a spin valve and an MTJ that are monolithically integrated to each other
Figure 5B:
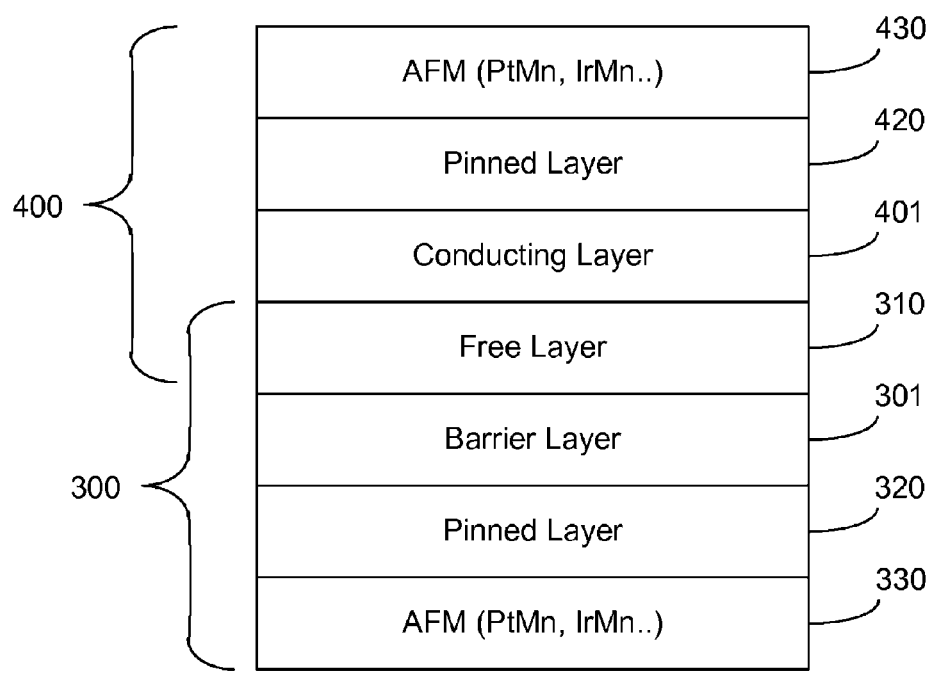
FIG. 5B shows another example of the magnetic element for the device in FIG. 2 in form of a combination of a spin valve and an MTJ that are monolithically integrated to each other and share a common free layer.

FIG. 5A shows an example of the magnetic element 201 in form of a combination of a spin valve 400 and an MTJ 300 that are monolithically integrated to each other. The free layer 410 in the spin valve 400 and the free layer 310 in the MTJ 300 are joined by a separation layer 510 formed between the free layers 310 and 410 to ensure the free layers 310 and 410 are magnetically coupled to each other through magnetostatic or exchange coupling. In operation, the applied current 240 flows through both the spin valve 400 and the MTJ 300 and the free layers 410 and 310 are both switched by spin-transfer torques when current 240 goes through the conductive spacer 401 and the tunnel barrier 301. The two free layers 410 and 310 are coupled together therefore the total effective volume is larger than a single free layer and the thermal stability is improved. FIG. 5B shows another example of the magnetic element 201 in form of a combination of a spin valve 400 and an MTJ 300 that are monolithically integrated to each other and share a common free layer 310. In operation, spin torques from both the conductive barrier 401 and the tunnel barrier 301 are exerted on the free layer 310, as a result the free layer 310 can be switched with a smaller current 240. The separation layer 510 in FIG. 5A is eliminated in this design and the fabrication process is simpler.

Figure 6A:
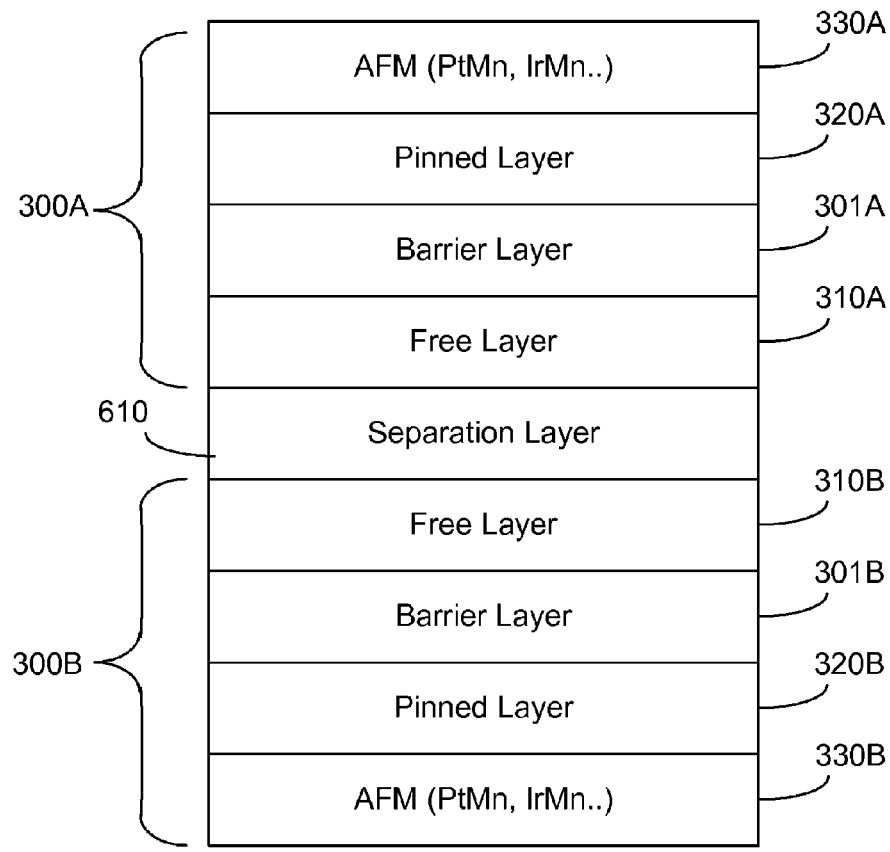
FIG. 6A shows an example of the magnetic element for the device in FIG. 2 in form of a combination of two stacked MTJs that are monolithically integrated to each other.
Figure 6B:
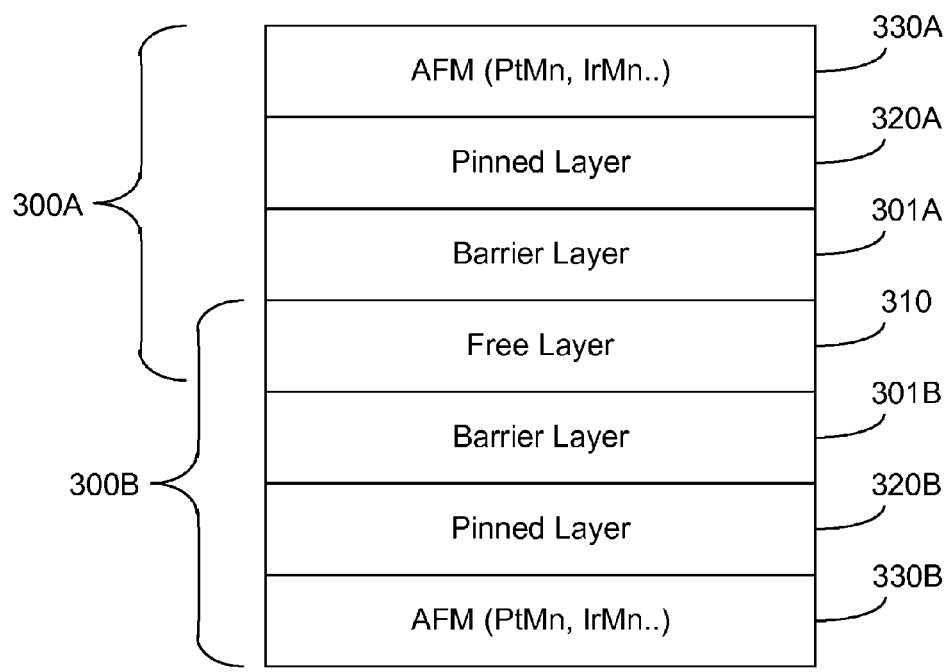
FIG. 6B shows another example of the magnetic element for the device in FIG. 2 in form of a combination of two stacked MTJs that are monolithically integrated to each other and share a common free layer

FIGS. 6A and 6B show two examples of the magnetic element 201 with two stacked MTJs 300A and 300B that are monolithically integrated to each other. The two MTJs 300A and 300B have structures similar to that of the MTJ 300 in FIG. 3 and can have different materials and layer constructions. The labels "A" and "B" are used to indicate corresponding layers in FIGS. 6A and 6B. In FIG. 6A, the free layer 310A in the MTJ 300A and the free layer 310B in the MTJ 300B are joined by a separation layer 610 formed between the free layers 310A and 310B to ensure the free layers 310A and 310B are magnetically coupled to each other through magnetostatic or exchange coupling. In FIG. 6B, the two MTJs 300A and 300B share a common free layer 310 and the separation layer 610 in FIG. 6A is eliminated. As compared with the MTJ-spin valve designs shown in FIG. 5A and FIG. 5B, dual MTJ structures shown in FIG. 6A and FIG. 6B can supply larger spin-transfer torque because MTJs have larger spin polarization than spin valves. MTJs also have less spin pumping effect on the free layer than spin valves because insulating tunnel barriers are good spin barriers as well. As a result the switching current can be smaller in dual MTJ structures, which is desirable for device application. The total resistance of dual MTJs is, however, usually larger than MTJ-spin valves because insulating tunnel barriers usually have larger resistance than conductive spacer layers. So for applications where resistance is a concern MTJ-spin valve structure may be preferred.

In the above and other magnetic RAM elements 201 based on the spin-transfer torque switching, a magnetic shielding element is provided to shield an external magnetic field from adversely affecting the switching operation because the switching is effectuated based on the spin-transfer torque between the spins carried by the drive current and the free layer. The magnetic shielding element can be located in a number of locations relative to the layers of the magnetic element 201, including a location between the magnetic element 201 and the conductor line 210 and the location on the opposite side of the conductor line 210. Specific examples for the magnetic shielding element are described below.

Figure 7:
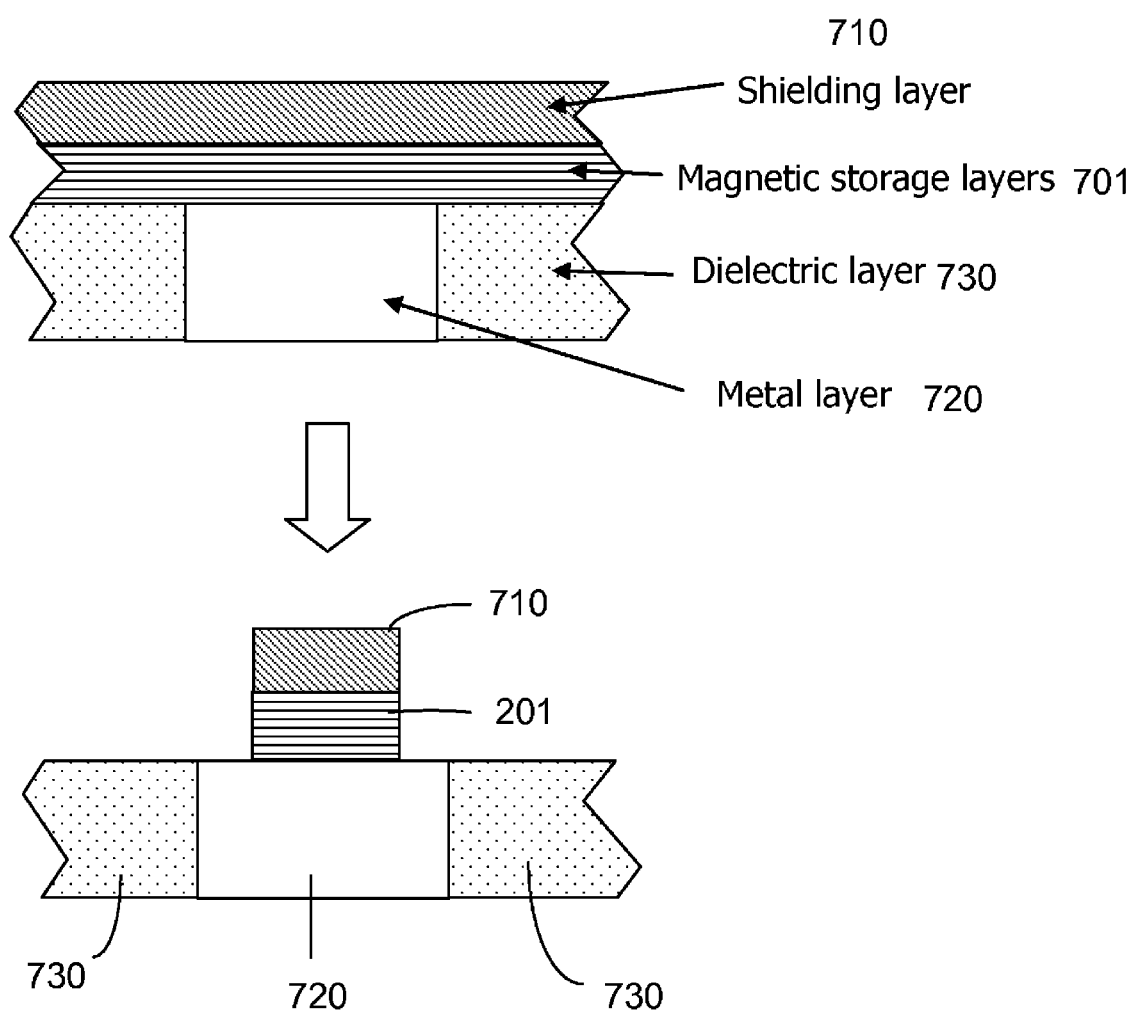
FIGS. 7, 8, 9 and 10 depict examples of magnetic shielding elements each made of a magnetic material exhibiting a positive susceptibility for the magnetic element for the device in FIG. 2 and the corresponding fabrication processes.

FIG. 7 depicts one example of a magnetic shielding element 710 formed on top of the magnetic element 201 and the corresponding fabrication process. Initially, a patterned dielectric layer 730 (e.g., an interlayer dielectric layer) and a metal layer 720 are formed in the same layer over the substrate. On top of this layer, a multilayer structure 701 having layers for the magnetic element 201 is formed and a magnetic shielding layer 710 made of a suitable magnetic material is deposited on top of the multilayer structure 701. An optional electrically conductive layer (e.g., with a thickness of less than 200 nm thick) can be placed as an intermediate layer between the multilayer structure 701 for the magnetic element 201 and the magnetic shielding layer 710. Next, the layers 710 and 701 are patterned into form the magnetic shielding element 710 and the magnetic element 201 on top of the metal layer 720. The magnetic shielding layer 710 can be patterned into the same or similar size with the magnetic element 201. As the size of the magnetic shielding layer 710 is reduced, the magnetostatic field produced by the magnetic shielding layer 710 increases when the magnetic shielding layer 710 is magnetized by an external magnetic field. This effect enhances the magnetic shielding efficiency. The magnetic shielding effect, although present, is reduced if the shielding layer 710 is much smaller than the magnetic element. The shielding layer 710 can have a thickness of from a few nanometers to a few hundred nanometers.

The magnetic material used in the magnetic shielding layer 710 is selected to exhibit a positive susceptibility under an external magnetic field. In addition, the magnetic shielding layer 710 is free of a net magnetization or exhibits a negligible net magnetization less than a threshold value in absence of an external magnetic field and after an external magnetic field previously present is subsequently removed or reduced to zero. Such a magnetic shielding layer 710 produces a magnetostatic field when an external field is applied to reduce or cancel the external field at the magnetic element 201 adjacent to the magnetic shielding layer 710. For example, a suitable material for the magnetic shielding layer 710 can be a paramagnetic material or a superparamagnetic material. When an external magnetic field is present, the magnetic shielding layer 710 is magnetized with its magnetization pointing to substantially the direction of the external magnetic field. This induced magnetization of the magnetic shielding layer 710 produces a magnetostatic field. At the position of the magnetic element 201, this magnetostatic field is in a direction opposite to the external magnetic field. The net magnetic field experienced by the magnetic element 201 is, therefore, the sum of the external magnetic field and the magnetostatic field that in opposite directions with respect to each other. Thus the external field in the magnetic element 201 can be partially or completely cancelled by the magnetostatic field produced by the magnetic shielding layer 710.

Most ferromagnetic and ferrimagnetic materials tend to have a non-zero magnetization when the external magnetic field is zero or removed, and the magnetization usually depends on the history of the magnetization with a hysteretic behavior. These materials are less preferable than the paramagnetic and superparamagnetic materials for the magnetic shielding layer 710. However, a carefully engineered soft ferromagnetic or ferrimagnetic material can have a low remanent magnetization when the external magnetic field is zero and have a low magnetic coercivity. Such an engineered soft ferromagnetic or ferrimagnetic material can be used as the shielding material for the magnetic shielding layer 710.

Because the magnetic element 201 does not operate based on the magnetic field generated by programming lines 240 and 250 in FIG. 2, the shielding layer 710 can be placed very close to the magnetic free layer of the magnetic element 201. Therefore the magnetic susceptibility of the shielding material does not have to be very high and the thickness of the shielding material can be reduced due to the short distance between the magnetic shielding layer 710 and the magnetic free layer in the magnetic element 201. These characteristics of the material and structure properties of the magnetic shielding layer 710 can simplify fabrication process.

Figure 8:
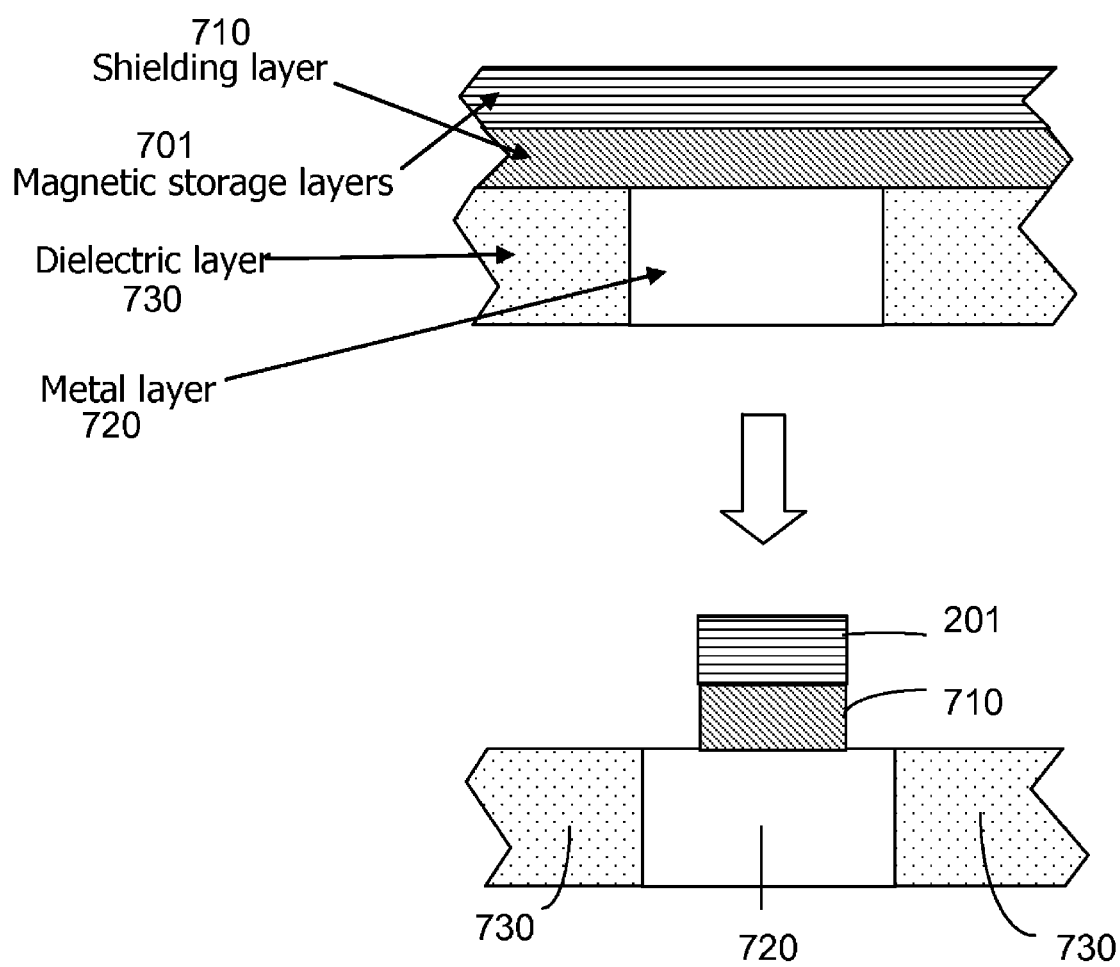

In FIG. 7, the magnetic shielding layer 710 is deposited above the magnetic element 201 and can be patterned by the same patterning process that patterns multilayer structure 701 into the magnetic element 201. FIG. 8 shows another design where the magnetic shielding layer 710 is deposited under the magnetic element 201 and can also be patterned during the same patterning processes with the magnetic element. In the examples shown in FIGS. 7 and 8, the magnetic shielding layer 710 is patterned to about the same size with the magnetic element 201 and can provide a large magnetostatic field to counter the external magnetic field. In some implementations, two overlay magnetic shielding layers each with a positive susceptibility can be formed on the top and bottom sides of the magnetic element 201, respectively, to enhance the magnetic shielding to the magnetic element 201.

Figure 9:
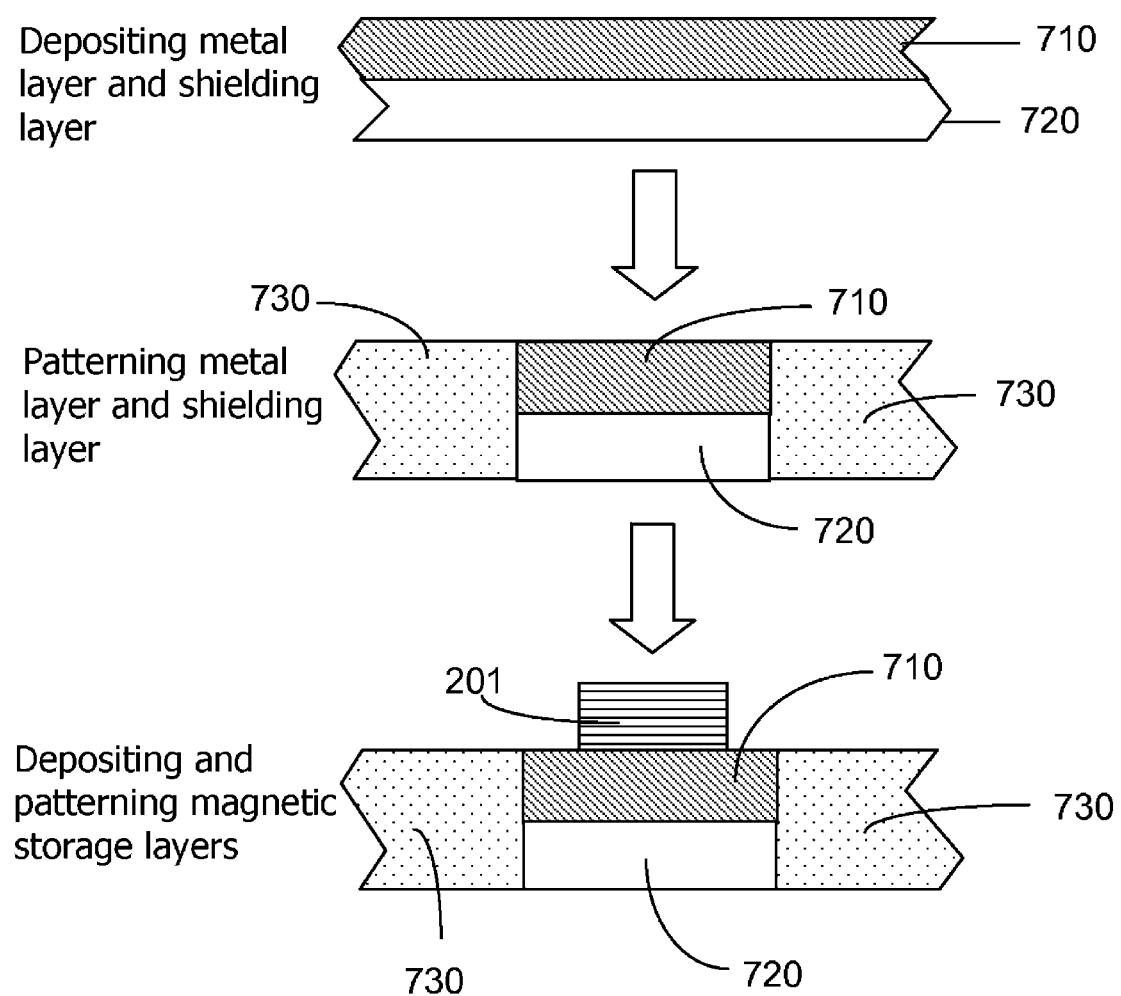

FIG. 9 depicts another example of a magnetic shielding element 710 formed underneath the magnetic element 201 and the corresponding fabrication process. The magnetic shielding element 710 is formed on top of the metal layer 720 which is patterned as the metal plug for supporting the magnetic element 201 on the top. Therefore, the magnetic shielding element 710 is patterned to overlap with the underlying metal layer 720 at the location of the magnetic element 201. In addition, the total thickness of the magnetic shielding element 710 and the underlying metal layer 720 may be set to be equal to the dielectric layer 730 so that the top surface of the magnetic shielding element 710 and the top surface of the dielectric layer 730 are co-planar. The magnetic shielding element 710 is patterned in the same patterning process with the metal layer 720 that may, in one implementation, a larger size than the magnetic element 201. Under this design, the shielding patterning step and the magnetic element patterning step are separated. This separation can be used to provide flexibility in the fabrication process.

Figure 10:
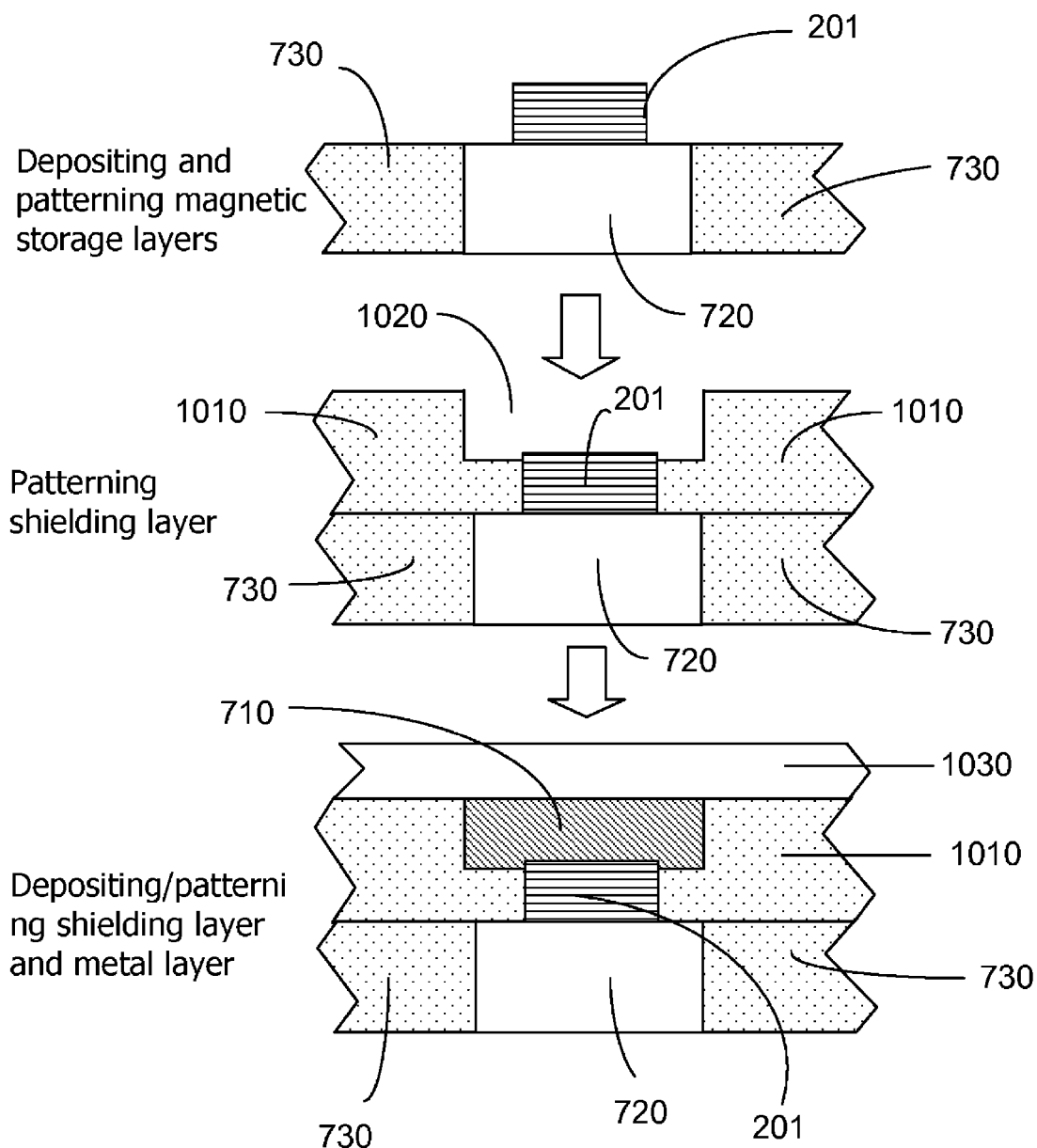

FIG. 10 shows another design for a magnetic shielding element 710 on top of the magnetic element 201 and is patterned in the same patterning process with a metal layer that is a part of a top conductive strap layer and may have a larger size than the magnetic element 201. A larger magnetic shielding layer 710 can generate a more uniform magnetostatic field on the magnetic free layer in the magnetic element 201 than a smaller magnetic shielding layer 710. The strength of the magnetostaic field produced by the larger magnetic shielding layer 710 may be decreased in comparison with the magnetostaic field produced by the smaller magnetic shielding layer 710 under the same external magnetic field. This effect can be offset by using a greater shielding layer thickness or a shielding material with a larger magnetic susceptibility. This design feature can also be applied to the design in FIG. 9.

In FIG. 10, the magnetic element 201 is located between the top magnetic shielding element 710 and the underlying metal plug formed in the patterned metal layer 720 that is co-planner with the dielectric layer 730. The magnetic shielding element 710 and the magnetic element 201 are in embedded in another dielectric layer 1010. A top metal strap layer 1030 is formed on top of the dielectric layer 1010 and the exposed top surface of the magnetic shielding element 710. Hence, the top metal strap layer 1030 and the bottom metal plug 720 form the top and bottom electrical contacts to supply the drive current through the top magnetic shielding element 710 and the magnetic element 201.

In fabrication, after the magnetic element 201 is formed on the metal layer 720, the second dielectric layer 1010 is formed over the exposed surface of the dielectric layer 730 and the magnetic element 201. Next, the second dielectric layer 1010 is patterned to form a trench pattern 1020 that exposes the top of the magnetic element 201. The magnetic and conductive material for the magnetic shielding element 710 is deposited in the trench pattern 1020 and may be subsequently polished to form a flat surface on top of the magnetic shielding element 710 and the dielectric layer 1010. The top metal strap layer 1030 is then formed. The above process allows for patterning the shielding layer in the same patterning process with the magnetic elements or other metal layers and thus reduce the number of patterning steps, the processing time and cost.

Figure 11A:
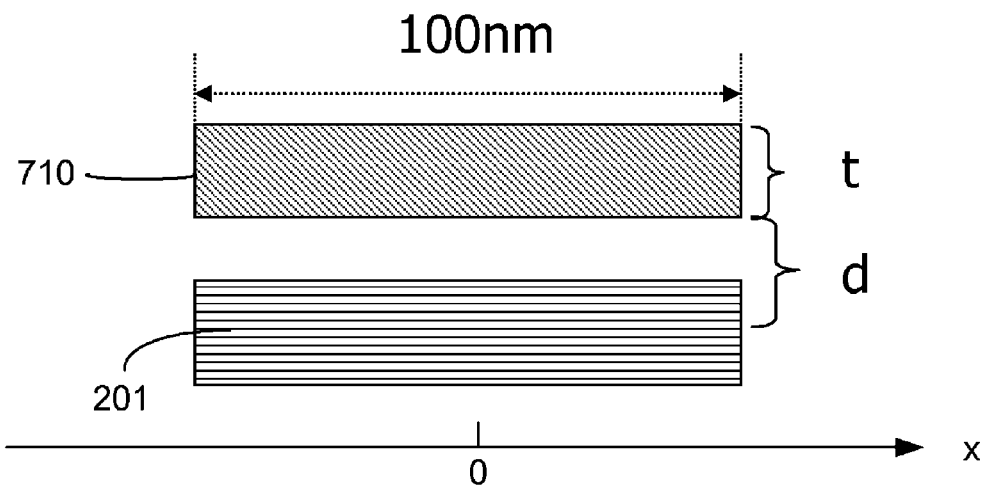
FIGS. 11A and 11B show a device model for a magnetically shielded magnetic element using a material with a positive susceptibility and the calculated shielding effect, respectively.

FIG. 11A shows a device model for a magnetic element 201 and a corresponding magnetic shielding element 710 with the same lateral dimension along layers with a spacing d from the closest end surface of the magnetic shielding element 710 to the center layer position of the free layer of the magnetic element 201. This model was used to perform simulations on the magnetic shielding produced by the magnetic shielding element 710 at the free layer.

Figure 11B:
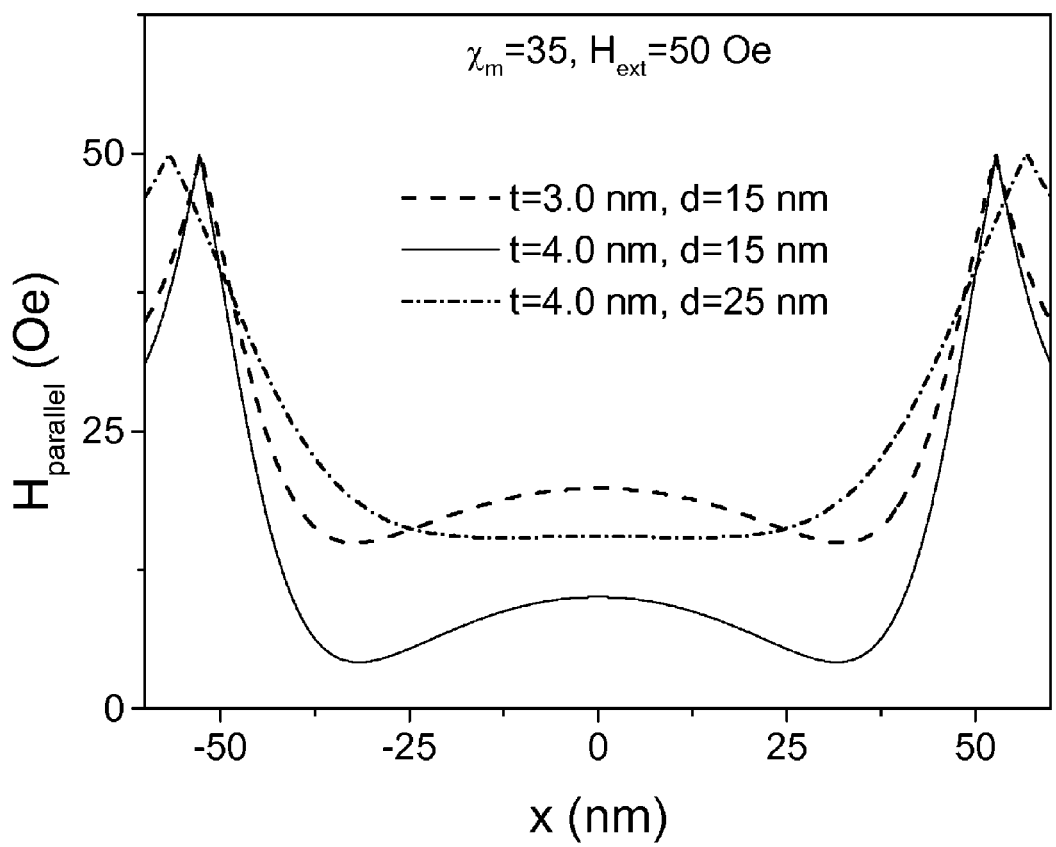

FIG. 11B shows the calculated shielding effect with the shielding layer 701 deposited above the magnetic element 201 with the magnetic susceptibility $X_m=35$ and external field H=50 Oe with a spacing d at different values for two thickness values of the shielding layer 701. The results show a significantly reduced total field by the shielding layer with using a shielding layer with a thickness of 4 nm. The horizontal axis represents the lateral position x from the center of the magnetic shielding layer 701 and the magnetic element 201.

Another approach to magnetically shielding the magnetic element from an external field is to use a magnetic shielding element with a negative susceptibility, e.g., made of a diamagnetic material. Under an external magnetic field, the material with a negative susceptibility is magnetized to exhibit a magnetization in a direction opposite to the field direction. Different from the above described magnetic shielding elements with a positive susceptibility which are placed above or below the magnetic element 201 to overlay the magnetic element 201, a magnetic shielding element with a negative susceptibility is placed within the plane of the magnetic element 201 to reduce or cancel an external magnetic field in the plane of the free layer within the magnetic element 201.

Figure 12:
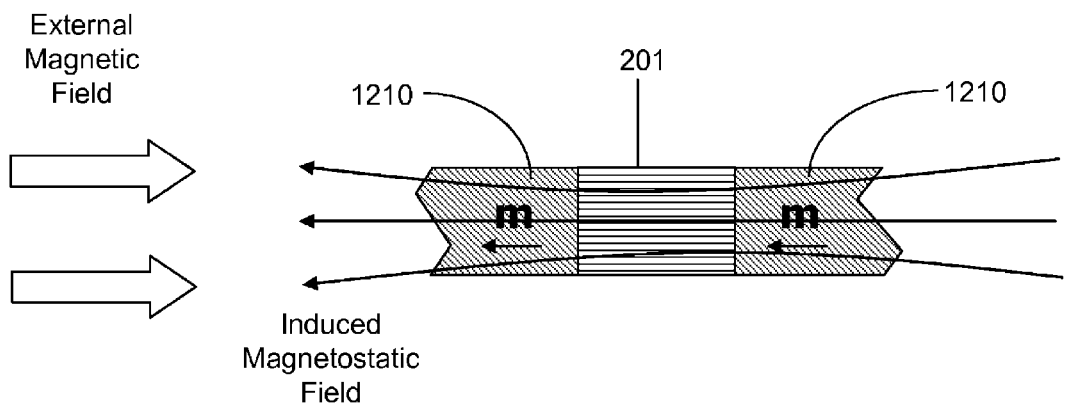
FIGS. 12 and 13 show examples of magnetic shielding elements each made of a magnetic material exhibiting a negative susceptibility for the magnetic element for the device in FIG. 2.

FIG. 12 shows a magnetic device in which the magnetic element 201 is placed between two or more pieces of, or is surrounded by or at least partially surrounded by a diamagnetic material forming the magnetic shielding element 1210. For example, a magnetic shielding layer made of the magnetic material 1210 that exhibits a negative susceptibility can be formed over the substrate and is patterned to include an opening that penetrates through the magnetic shielding layer. The magnetic element 201 is located inside the opening of the magnetic shielding layer 1210 to be surrounded by the magnetic material of the magnetic shielding layer 1210. In this example, the magnetic element 201 is surrounded by the magnetic shielding layer 1210 on the sides of the magnetic element 201 while being exposed on the top and bottom sides of the magnetic element 201. In an array of magnetic elements 201, the magnetic shielding material 1210 can be located between adjacent magnetic elements 201 to provide magnetic shielding. When an external magnetic field is present at the magnetic element 201, the diamagnetic material 1210 is magnetized and produces a magnetostatic field in response to the applied external magnetic field. At the location of the magnetic element 201, this magnetostatic field is opposite to the external field direction and thus reduces or cancels the effect of the external magnetic field on the magnetic element 201. In this configuration, if a ferromagnetic, ferromagnetic, paramagnetic or superparamagnetic material with positive susceptibility is used instead of the diamagnetic material, the induced magnetostatic field will enhance the externally applied magnetic field and is not desirable for shielding purpose.

The diamagnetic material 1210 can be electrically insulating, electrically conductive or electrically semiconductive. When an insulating diamagnetic material 1210 is used, it can be used as the insulating material substituting a non-magnetic dielectric material as the interlayer dielectric material, e.g., SiOx or SiNx. Therefore, the patterning process for making the device in FIG. 12 may be the standard damanscene process without extra patterning steps. If the diamagnetic material 1210 is electrically conductive or semiconductive, an insulating material can be used to insulate the diamagnetic material 1210 and prevent it from shorting other parts of the circuit for the magnetic element.

Figure 13:
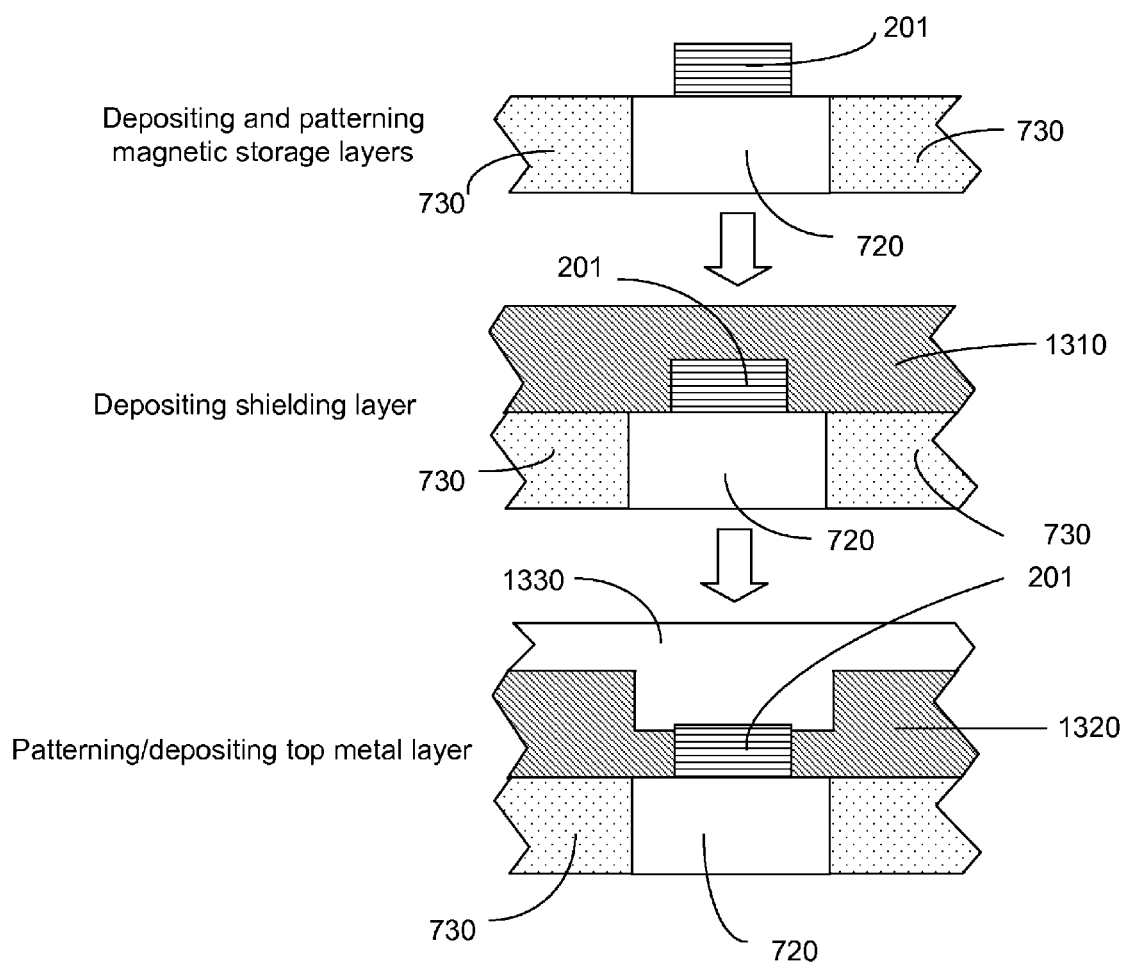

FIG. 13 shows an example of a magnetically shielded magnetic element based on the shielding design in FIG. 12. The magnetic element 201 is formed on a metal plug 720 embedded in the dielectric layer 730. A magnetic shielding layer 1320 is formed on top of the metal plug 720 and the dielectric layer 730 is patterned to surround the magnetic element 201 and to expose the top surface of the magnetic element 201. A top metal conductor 1330 is formed on top of the magnetic element 201 and the magnetic shielding layer 1320.

Figure 14A:
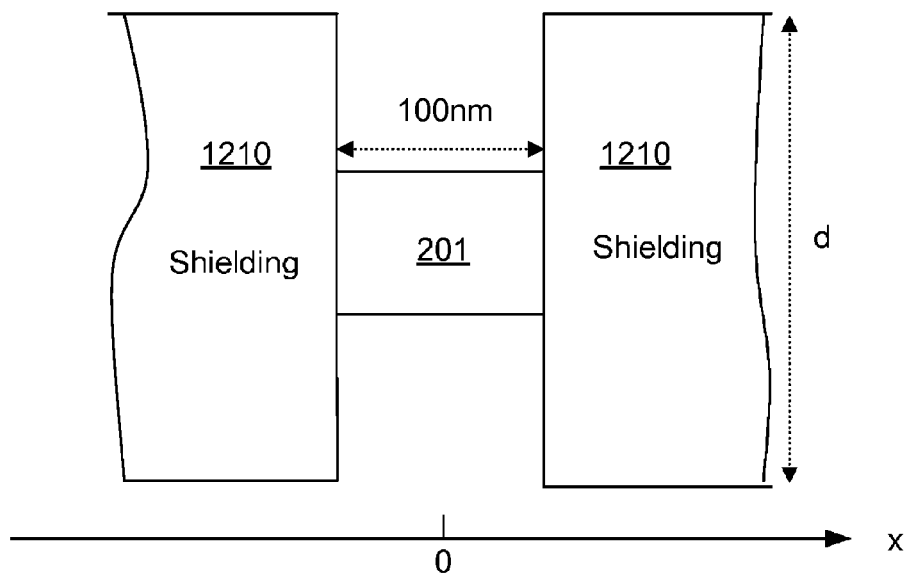
FIGS. 14A and 14B show a device model for a magnetically shielded magnetic element using a material with a negative susceptibility and the calculated shielding effect, respectively.

FIG. 14A shows a device model for a magnetic element 201 and a corresponding diamagnetic shielding element 1210 on each of two opposites sides of the magnetic element 201. The lateral width along the layers of the magnetic element 201 is 100 nm and the thickness of the diamagnetic shielding element 1210 is d which is greater than the thickness of the free layer of f the magnetic element 201 (e.g., several nanometers). The magnetic element 201 is placed along the vertical direction in the center position of the magnetic shielding element 1210. This model was used to perform simulations on the magnetic shielding produced by the magnetic shielding element 1210 at the magnetic element 201.

Figure 14B:
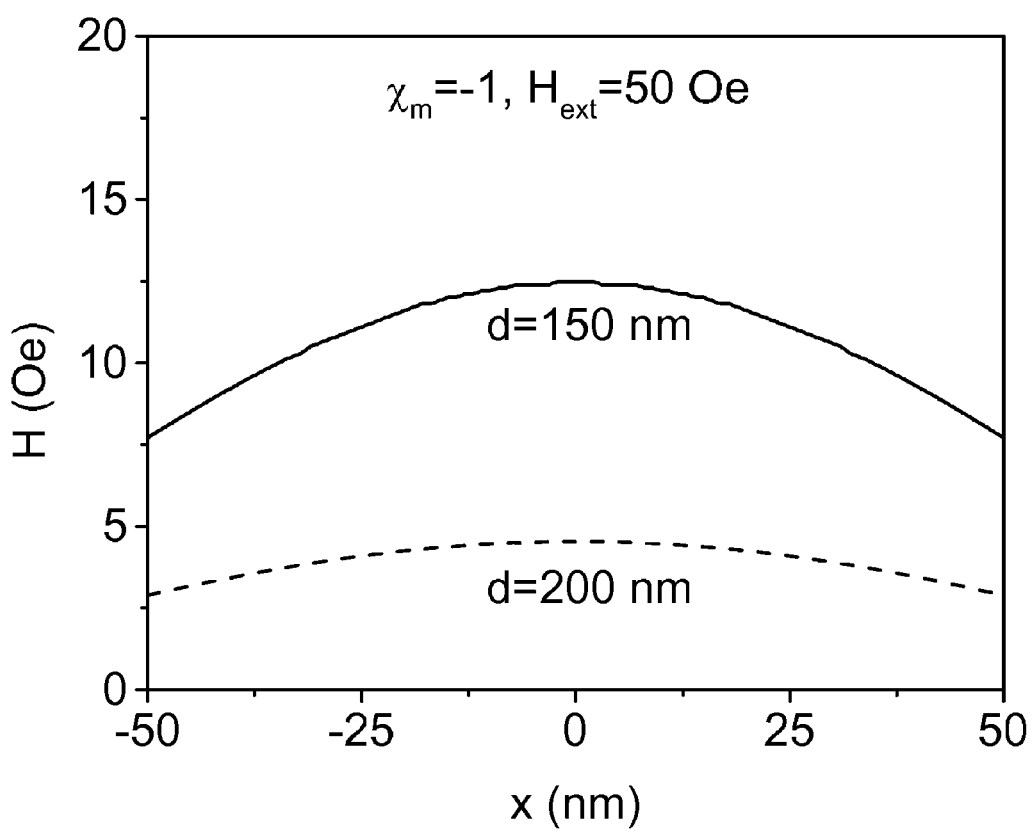

FIG. 14B shows the calculated shielding effect with the shielding layer 701 deposited above the magnetic element 201 with the magnetic susceptibility $\chi_m=-1$ and external field H=50 Oe for different d values. The results show a significantly reduced total field by the shielding layer. The horizontal axis represents the lateral position x from the center of the magnetic element 201. The thickness of the diamagnetic shielding element 1210 can be set to be greater than the thickness of the magnetic element 201 to provide strong magnetic shielding.

Figure 15:
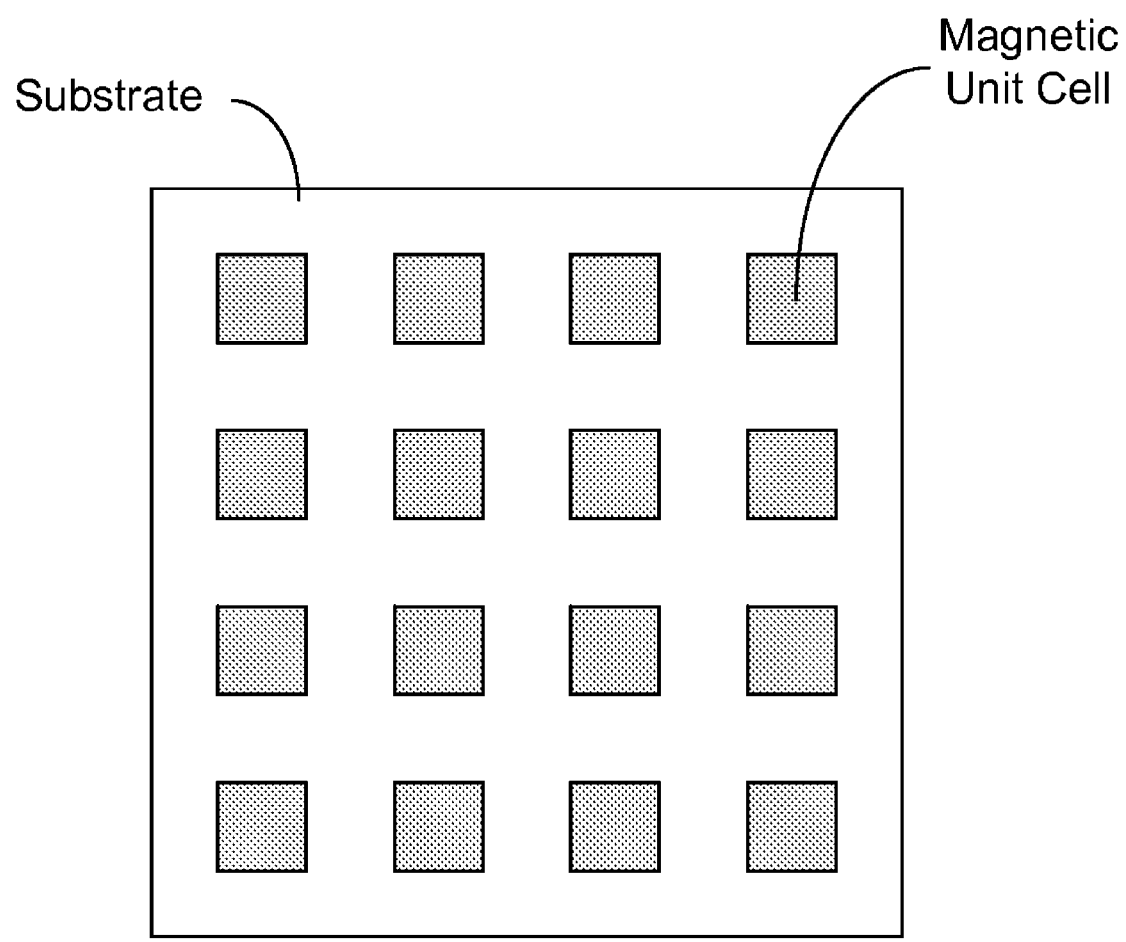
FIG. 15 show a magnetic device with an array of magnetic cells based on the device design in FIG. 2.

In various applications, the magnetically shielded magnetic cell shown in FIG. 2 is implemented as a unit cell of a magnetic array. FIG. 15 shows a bird view of an example of such an array formed on a substrate as an integrated circuit chip.

Figure 16:
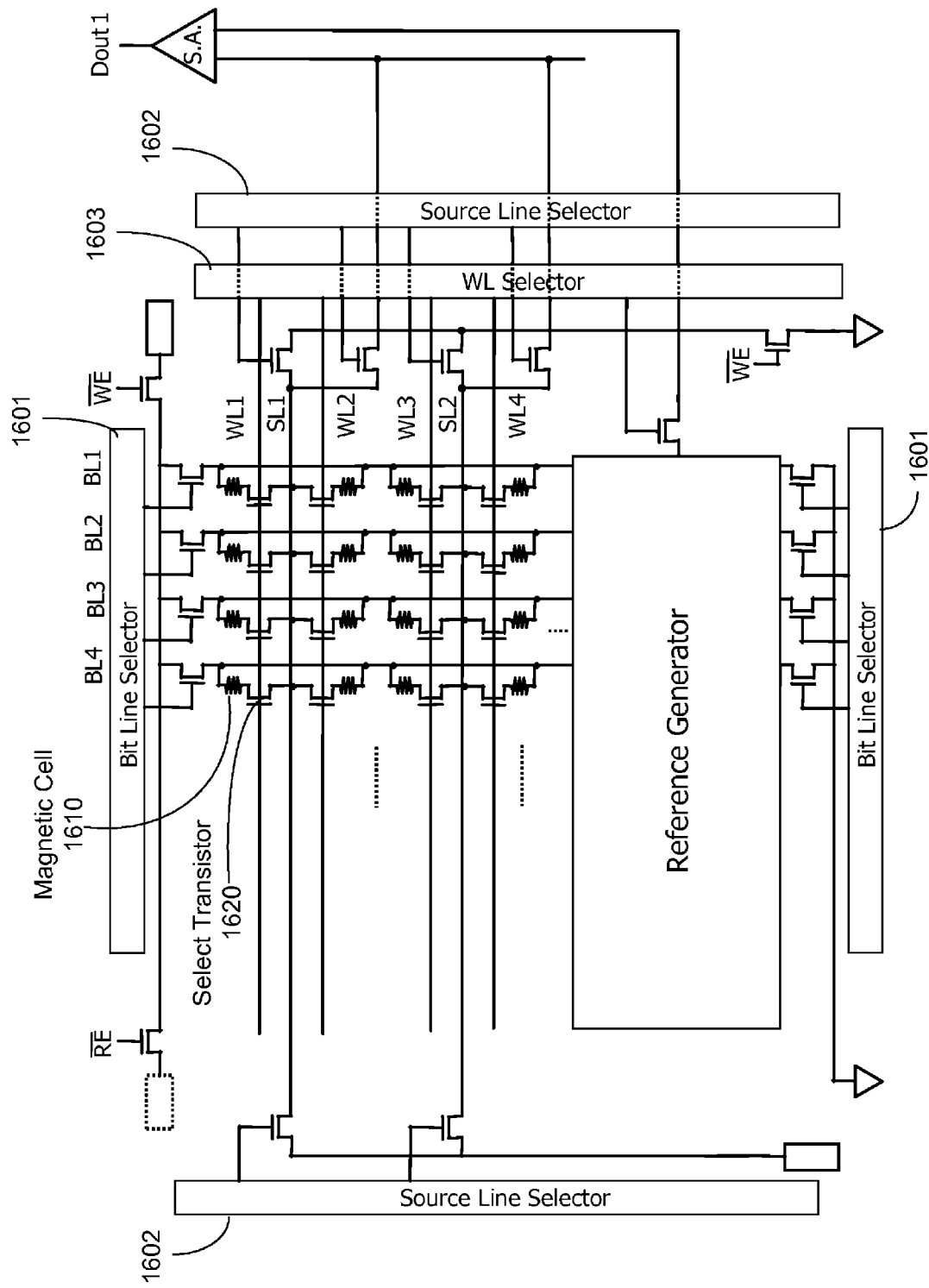
FIG. 16 shows one implementation of the device in FIG. 15 illustrating a circuit that operates the device based on spin-transfer torque switching.

FIG. 16 shows one implementation of the device in FIG. 15 illustrating a circuit that operates the device based on spin-transfer torque switching. Each magnetic cell is magnetically shielded based on one of the shielding designs in this application and is operated based on the spin-transfer torque (STT) switching. The cells 1610 can be arranged and connected in an array in a common way without special requirement for the bit/source lines. Each cell 1610 is connected in series to a select transistor 1620 which corresponds to the isolation device 230 in FIG. 2. As illustrated, a bit line selector 1601, a source line selector 1602 and a word line selector 1603 are coupled to the cell array to control the operations of each cell.

While this specification contains many specifics, these should not be construed as limitations on the scope of an invention that is claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination.

Only a few examples and implementations are described. Other implementations, variations, modifications and enhancements to the described examples and implementations may be made.

What is claimed is:

1. A device, comprising:
a substrate;
a magnetic cell formed over the substrate and comprising:
a first ferromagnetic layer exhibiting a first magnetization that is switchable between a first direction and a second substantially opposite direction under a spin-transfer torque effect caused by an electric current;
a second ferromagnetic layer having a fixed magnetization along one of the first and second directions; and
a non-magnetic spacer layer formed between the first and second ferromagnetic layers to allow for passage of the electric current between the first and second ferromagnetic layers;
a magnetic shielding layer formed over the substrate and comprising a magnetic material that exhibits a negative susceptibility, the magnetic shielding layer patterned to comprise an opening that penetrates through the magnetic shielding layer, wherein the magnetic cell is located inside the opening of the magnetic shielding layer to be surrounded by the magnetic material of the magnetic shielding layer; and
a circuit electrically coupled to the magnetic cell and operable to supply the electric current flowing through the magnetic cell.

2. The device of claim 1, wherein:
the spacer layer is an insulator layer configured to effectuate tunneling of electrons between the first and second ferromagnetic layers to form a first magnetic tunnel junction.

3. The device of claim 2, comprising:
additional layers forming a second magnetic tunnel junction and being monolithically integrated to and stacked with the magnetic tunnel junction.

4. The device of claim 3, wherein:
the second magnetic tunnel junction comprises:
a third ferromagnetic layer exhibiting a magnetization that is switchable between a first direction and a second substantially opposite direction under a spin-transfer torque effect caused by the electric current passing through the first and second magnetic tunnel junctions, the third ferromagnetic layer being magnetically coupled with the first ferromagnetic layer;
a fourth ferromagnetic layer having a fixed magnetization in one of the first and second directions; and
a second non-magnetic insulator spacer layer formed between the third and fourth ferromagnetic layers to allow for tunneling of electrons and thus passage of the electric current between the third and fourth ferromagnetic layers.

5. The device of claim 3, wherein:
the second magnetic tunnel junction comprises:
a third ferromagnetic layer having a fixed magnetization in one of the first and second directions; and
a second non-magnetic insulator spacer layer formed between the first and third ferromagnetic layers to form the second magnetic tunnel junction with the first and third ferromagnetic layers and to allow for tunneling of electrons and thus passage of the electric current between the first and third ferromagnetic layers.

6. The device of claim 1, wherein:
the spacer layer is an electrically conductive layer to form a spin valve with the first and second ferromagnetic layers.

7. The device of claim 6, comprising:
additional layers forming a magnetic tunnel junction and being monolithically integrated to and stacked with the spin valve.

8. The device of claim 7, wherein:
the magnetic tunnel junction comprises:
a third ferromagnetic layer exhibiting a magnetization that is switchable between a first direction and a second substantially opposite direction under a spin-transfer torque effect caused by the electric current passing through the spin valve and the magnetic tunnel junction, the third ferromagnetic layer being magnetically coupled with the first ferromagnetic layer;
a fourth ferromagnetic layer having a fixed magnetization in one of the first and second directions; and
a non-magnetic insulator spacer layer formed between the third and fourth ferromagnetic layers to allow for tunneling of electrons and thus passage of the electric current between the third and fourth ferromagnetic layers.

9. The device of claim 7, wherein:
the magnetic tunnel junction comprises:
a third ferromagnetic layer having a fixed magnetization in one of the first and second directions; and
a non-magnetic insulator spacer layer formed between the first and third ferromagnetic layers to form the magnetic tunnel junction with the first and third ferromagnetic layers and to allow for tunneling of electrons and thus passage of the electric current between the first and third ferromagnetic layers.

10. The device of claim 1, wherein:
the magnetic shielding layer is electrically conductive or semiconductive, and is electrically insulated from the magnetic cell.

11. The device of claim 1, wherein:
the magnetic shielding layer is an electrical insulator.

12. A device, comprising:
a conductor line;
a plurality of magnetic cells, each magnetic cell electrically connected to the conductor line to receive an electric current, each magnetic cell comprising (1) a magnetic element to have a ferromagnetic free layer to switch a magnetization direction under a spin-transfer torque caused by the electric current when the electric current is above a threshold current, and (2) a magnetic shielding element engaged to the magnetic element to magnetically shield the magnetic element from a magnetic field produced by a current in the conductor line and a source outside the magnetic cell; and
a circuit comprising a plurality isolation transistors, each isolation transistor electrically connected to a magnetic element inside a respective magnetic cell to control the electric current through the magnetic element.

13. The device as in claim 9, wherein:
the magnetic shielding element is made of a magnetic material exhibiting a positive susceptibility and is located so that the magnetic element is located between the conductor line and the magnetic shielding element in each magnetic cell.

14. The device as in claim 12, wherein:
the magnetic shielding element is made of a magnetic material exhibiting a positive susceptibility and is located between the conductor line and the magnetic element in each magnetic cell.

15. The device as in claim 12, wherein:
the magnetic shielding element is made of a magnetic material exhibiting a negative susceptibility and is structured to at least partially surround the magnetic element.

* * * * *

UNITED STATES PATENT AND TRADEMARK OFFICE
CERTIFICATE OF CORRECTION

| | | |
|---|---|---|
| PATENT NO. | : 7,957,179 B2 | |
| APPLICATION NO. | : 11/769645 | |
| DATED | : June 7, 2011 | |
| INVENTOR(S) | : Yunfei Ding | |

It is certified that error appears in the above-identified patent and that said Letters Patent is hereby corrected as shown below:

Column 14, line 14, please delete "claim 9" and insert --claim 12-- therefor.

Signed and Sealed this
Twenty-sixth Day of July, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,957,179 B2 | Page 1 of 1 |
| APPLICATION NO. | : 11/769645 | |
| DATED | : June 7, 2011 | |
| INVENTOR(S) | : Ding et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 7 days.

Signed and Sealed this
Twenty-seventh Day of September, 2011

David J. Kappos
*Director of the United States Patent and Trademark Office*